(12) United States Patent
Ramkumar et al.

(10) Patent No.: US 6,777,307 B1
(45) Date of Patent: Aug. 17, 2004

(54) METHOD OF FORMING SEMICONDUCTOR STRUCTURES WITH REDUCED STEP HEIGHTS

(75) Inventors: Krishnaswamy Ramkumar, San Jose, CA (US); Steven S. Hedayati, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 203 days.

(21) Appl. No.: 10/010,833

(22) Filed: Dec. 4, 2001

(51) Int. Cl.$^7$ ............................................. H01L 21/76
(52) U.S. Cl. ...................... 438/424; 438/425; 438/437; 438/691; 438/692
(58) Field of Search ................. 438/424–426, 438/437–439, 691–695

(56) References Cited

U.S. PATENT DOCUMENTS

| | | | | |
|---|---|---|---|---|
| 5,780,346 A | * | 7/1998 | Arghavani et al. | 438/296 |
| 6,114,216 A | * | 9/2000 | Yieh et al. | 438/424 |
| 6,348,389 B1 | * | 2/2002 | Chou et al. | 438/305 |
| 6,350,662 B1 | * | 2/2002 | Thei et al. | 438/435 |
| 6,368,931 B1 | * | 4/2002 | Kuhn et al. | 438/359 |
| 6,410,403 B1 | * | 6/2002 | Wu | 438/424 |
| 6,509,271 B1 | * | 1/2003 | Kobayashi | 438/692 |

OTHER PUBLICATIONS

Wolf et al., Silicon Processing for the VLSI Era, vol. 1, 1986, pp. 532–533.*

* cited by examiner

Primary Examiner—Duy-Vu Deo
(74) Attorney, Agent, or Firm—Kevin L. Daffer; Mollie E. Lettiang

(57) ABSTRACT

A method is provided which includes planarizing structures and/or layers such that step heights of reduced and more uniform thicknesses may be formed. In particular, a method is provided which includes polishing an upper layer of a topography to expose a first underlying layer and etching away remaining portions of the first underlying layer to expose a second underlying layer. The topography may then be subsequently planarized. As such, a method for fabricating shallow trench isolation regions may include forming one or more trenches extending through a stack arranged over a semiconductor substrate. Such a method may further include blanket depositing a dielectric over the trenches and the stack of layers such that the trenches are filled by the dielectric. The dielectric may then be planarized such that upper surfaces of the dielectric remaining within the trenches are coplanar with an upper surface of an adjacent layer of the stack.

24 Claims, 3 Drawing Sheets

METHOD OF FORMING SEMICONDUCTOR STRUCTURES WITH REDUCED STEP HEIGHTS

BACKGROUND OF THE INVENTION

1. Field of the Invention

This invention relates to semiconductor device manufacturing, and more particularly, to an improved method for processing a semiconductor topography.

2. Description of the Related Art

The following descriptions and examples are not admitted to be prior art by virtue of their inclusion within this section.

Forming substantially planar surfaces during the processing of a semiconductor topography may involve numerous fabrication steps. For example, a layer may be deposited across a previously patterned layer of a semiconductor topography. Elevational disparities of such a deposited layer may be reduced by planarizing the layer. In some embodiments, an opening or a trench may be formed within a semiconductor topography and subsequently filled with a layer of trench fill material. In this manner, the layer of trench fill material may be formed within the opening and on an upper surface of the semiconductor surface. The layer of trench fill material may then be planarized such that an upper surface of the structure within the trench may be substantially coplanar with an upper surface of the semiconductor topography.

Substantially planar surfaces within a semiconductor topography may play an important role in fabricating overlying layers and structures. For example, step coverage problems may arise when a material is deposited over a surface having raised and recessed regions. Step coverage is defined as a measure of how well a film conforms over an underlying step and is expressed by the ratio of the minimum thickness of a film as it crosses a step to the nominal thickness of the film over horizontal regions. Furthermore, correctly patterning layers upon a surface containing fluctuations in elevation may be difficult using optical lithography. The depth-of-focus of the lithography alignment system may vary depending upon whether the resist resides in an elevational "hill" or "valley" area. Furthermore, substantially planar surfaces may become increasingly important as the feature sizes of semiconductor devices are reduced, since the depth of focus required to pattern an upper surface of a topography may increase with reductions in feature size. If a topography is nonplanar, the patterned image may be distorted and the intended structure may not be formed to the specifications of the device.

A technique that is often used to planarize or remove the elevational fluctuations in the surface of a semiconductor topography is chemical mechanical polishing "CMP." A conventional CMP process may involve placing a semiconductor wafer face-down on a polishing pad which lies on or is attached to a table or platen. During the CMP process, the polishing pad and/or the semiconductor wafer may be set into motion as the wafer is forced against the pad. An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. Therefore, the CMP process may employ a combination of chemical stripping and mechanical polishing to form a planarized surface.

Unfortunately, a CMP process may not form a substantially planar surface across an entire semiconductor topography. For instance, the slurry may react in recessed regions, causing those regions to be excessively etched. Furthermore, the polishing rate of the CMP may be dependent upon the polish characteristics of the topography. In addition, the polishing pad, being somewhat conformal to the surface topography, may deform in response to polishing laterally adjacent layers comprising different polish properties. Therefore, while the removal rate of raised regions of the dielectric may be greater than that of the recessed regions in a typical CMP process, a significant amount of the recessed regions may, unfortunately, undergo removal. This phenomena is known as the "dishing" effect and may reduce the degree of planarization that can be achieved by the CMP process. Consequently, the "dishing" effect may cause upper surfaces of structures and layers to curve below polished upper surfaces of adjacent structures or layers. For example, the dishing effect resulting from the fabrication of shallow trench isolation regions may be so severe that portions of the isolation regions may extend below the upper surface of the substrate. Consequently, the active regions of the device may not be adequately isolated.

To insure that the upper surfaces of structures and layers are above or coplanar with upper surfaces of adjacent structures and layers, a polish stop layer may be used to terminate the polishing process at an elevation higher than the intended height of the polished structure or layer. The composition of the polish stop layer is such that it polishes much more slowly than the layer above it. In this manner, polishing may be substantially terminated upon exposing the polish stop layer. Thus, layers or structures formed upon the semiconductor topography adjacent to the polish stop layer may also be polished to approximately the same elevation level as the polish stop layer. Silicon nitride is commonly used as a polish stop layer since it is a relatively hard material, particularly compared to silicon dioxide.

As such, a technique used to form shallow trench isolation regions, for example, may include depositing a layer of silicon nitride ("nitride") across an upper surface of a semiconductor substrate. In some cases, a "pad" oxide layer may be interposed between the substrate and nitride layer to reduce inherent stresses between nitride and silicon. Portions of the nitride layer and substrate may be etched away to define a trench within the substrate. Fill oxide (e.g., silicon dioxide) may then be deposited into the trench to a level spaced above the upper surface of the nitride layer. The resulting upper surface of the fill oxide includes a recessed region elevationally raised above the trench area. A trench isolation region may then be formed by subjecting the semiconductor topography to a CMP process. The polish rate of the nitride layer is slower than that of the fill oxide and thus, the nitride layer may act as a polish stop layer. Subsequent to the CMP process, the nitride layer may be removed by a nitride strip followed by a selective etch technique to remove the pad oxide.

The problem of the "dishing effect" described above is particularly evident during the aforementioned method of forming shallow isolation regions. In addition to the deformation of the polishing pad and the reaction of the slurry in recessed regions of the fill oxide, the "dishing effect" may be further augmented by "overpolishing" the polish stop layer. In particular, the surface of the polish stop layer may be "overpolished" or polished to a level spaced below the original upper surface of the polish stop layer to ensure that the fill oxide no longer resides above the polish stop layer. Furthermore, the "dishing effect" may be dependent on the pattern density of the topography. For example, a topography having relatively wide spaces between the isolation regions may include a large amount of nitride across the lateral portion of the topography, which typically results in a slower polish rate. Alternatively, topographies having relatively narrow spaces between isolation regions may include less nitride across the lateral surface of the semiconductor topography, typically resulting in a faster polish rate. Consequently, a thicker layer of nitride may be needed to compensate for the increase in the polish rate. In an embodiment that includes a varied pattern density (i.e., isolation regions spaced non-uniformly across a semiconductor substrate), portions of the topography with a large of amount of nitride may be etched at a different rate than the portions of the topography with a small amount of nitride. As such, a substantially non-planar surface may result and isolation regions of differing heights may be produced.

Therefore, it may be advantageous to form a polish stop layer having a sufficient thickness such that the "dishing effect" does not extend below the uppermost surface of the substrate subsequent to polishing. Typically, the thickness of the polish stop layer in such an embodiment may be greater than approximately 1500 angstroms and possibly greater than approximately 2000 angstroms. Unfortunately, the use of such a relatively thick polish stop layer may create a significant step height between the resulting shallow trench isolation region and adjacent regions upon removal of the polish stop layer. For example, a step height resulting from the use of a relatively thick polish stop layer may have a thickness between approximately 800 angstroms and approximately 1000 angstroms. Unfortunately, such a step height may be significant enough to cause the aforementioned problems associated with non-planar surfaces. "Step height" as used herein refers to the upper portion of a structure that extends above the upper surface of adjacent topography regions.

Accordingly, it would be advantageous to develop a method for planarizing a semiconductor topography to form structures and layers having small and relatively uniform step heights. Such a method may be particularly advantageous during the formation of shallow trench isolation regions.

SUMMARY OF THE INVENTION

The problems outlined above may be in large part addressed by a method for processing a semiconductor topography. In particular, a method is provided which includes planarizing structures and/or layers such that step heights of reduced and more uniform height may be formed. Such a method may include polishing an upper layer of a semiconductor topography to expose a first underlying layer. In addition, the method may include etching away remaining portions of the first underlying layer to expose a second underlying layer and subsequently planarizing the topography. In some cases, the method may include forming the upper layer, first underlying layer, and second underlying layer upon a semiconductor layer and in a single process chamber prior to the polishing, etching, and planarizing processes. Alternatively, the method may include forming each of the layers in one or more different process chambers.

Such a method may be particularly advantageous for the formation of shallow trench isolation regions. As such, a method for fabricating shallow trench isolation regions may include forming one or more trenches extending through a stack of at least three layers arranged over a semiconductor substrate. Such a method may further include blanket depositing a dielectric over the trenches and the stack of layers such that the trenches are filled by the dielectric. The dielectric may then be planarized such that upper surfaces of the dielectric remaining within the trenches are coplanar with an upper surface of an adjacent layer of the stack. In some cases, planarizing the dielectric may include removing one or more layers of the stack. Consequently, the method provided herein may produce a semiconductor topography with one or more trench isolation regions arranged within a semiconductor substrate and a plurality of layers arranged laterally adjacent to the trench isolation regions and upon the semiconductor substrate. In some embodiments, the upper surfaces of the trench isolation regions may be above the plurality of layers.

In an embodiment, the method described herein may include polishing an upper layer of a semiconductor topography to expose a first underlying layer. In a preferred embodiment, polishing the upper layer may include removing portions of the upper layer arranged above the upper surface of the first underlying layer. In some cases, polishing the upper layer may further include polishing a portion of the first underlying layer. In such an embodiment, the thickness of the first underlying layer is preferably sufficient to prevent polishing through the first underlying layer. In addition or alternatively, the method may include depositing the upper layer within a trench of the semiconductor topography prior to polishing the upper layer. In such an embodiment, polishing the upper layer may include polishing the upper layer such that remaining portions of the upper layer are laterally confined by sidewalls of the trench. Regardless of the formation of the upper layer, the method may further include etching away remaining portions of the first underlying layer to expose a second underlying layer and subsequently planarizing the topography. In addition or alternatively, the method may include etching the planarized topography such that a third underlying layer is removed. The third underlying layer, in such an embodiment, may be arranged beneath the second underlying layer. In some embodiments, etching the planarized topography may further include removing a portion of the second underlying layer.

A method for fabricating shallow trench isolation regions is also provided herein. Such a method may include forming one or more trenches extending through a stack of at least three layers arranged over a semiconductor substrate. Such a stack of layers may be formed in a single process chamber or one or more different process chambers prior to the formation of the trenches. The method may further include blanket depositing a dielectric over the trenches and the stack of layers such that the trenches are filled by the dielectric. The dielectric may then be planarized such that upper surfaces of the dielectric remaining within the trenches are coplanar with an upper surface of an adjacent layer of the stack In addition, the method may include etching the upper surface of the adjacent layer to expose the semiconductor substrate. In some embodiments, upper portions of the dielectric may extend less than approximately 500 angstroms above the upper surface of the semiconductor substrate subsequent to etching the upper surface. More specifically, the upper portions of the dielectric may extend between approximately 300 angstroms and approximately 500 angstroms above the upper surface of the semiconductor substrate subsequent to etching the upper surface. In either embodiment, the average thicknesses of the upper portions of the dielectric layer extending above the semiconductor substrate and corresponding to each of the trenches may, in some embodiments, differ by less than approximately 10%, or more preferably by less than approximately 5%.

In a preferred embodiment, planarizing may include removing one or more layers of the stack. For example, planarizing may include polishing the dielectric to expose an upper layer of the stack and etching the upper layer to expose an intermediate layer of the stack. In addition, planarizing the dielectric may include polishing the etched topography to expose the upper surface of an adjacent layer of the stack. In a preferred embodiment, subsequently polishing the topography is sufficient to produce a substantially planar surface without dishing portions of the adjacent layer. In some cases, the adjacent layer may include a lower layer of the stack arranged beneath the intermediate layer. Alternatively, the adjacent layer may include the intermediate layer.

Preferably, the stack may include intervening layers of different etching characteristics. In some embodiments, the intermediate layer and the dielectric may include similar etch characteristics. Likewise, the upper layer and lower layer may include similar etch characteristics in some embodiments. In addition or alternatively, the stack may include intervening layers of different polishing characteristics. For example, the upper layer of the stack may include silicon nitride, while the intermediate layer may include silicon dioxide and the lower layer may include silicon nitride. In some embodiments, the thickness of the upper layer may be between approximately 500 angstroms and approximately 1000 angstroms prior to planarizing the dielectric. The thickness of the intermediate layer, for example, may be between approximately 300 angstroms and approximately 700 angstroms prior to planarizing the dielectric. The thickness of the lower layer, on the other hand, may be between approximately 300 angstroms and approximately 500 angstroms prior to planarizing the dielectric.

Consequently, the method as described herein may form a semiconductor topography including one or more trench isolation regions arranged within a semiconductor substrate and a plurality of layers arranged laterally adjacent to the trench isolation regions and upon the semiconductor substrate. In some embodiments, the plurality of layers may include a silicon nitride layer arranged above the semiconductor substrate and a silicon dioxide layer arranged upon the silicon nitride layer. In addition or alternatively, the upper surfaces of the trench isolation regions may be above the plurality of layers. For example, the upper surfaces of the trench isolation regions may be above the plurality of layers by an amount between approximately 300 angstroms and approximately 1000 angstroms. In some embodiments, the trench isolation regions may include two trench isolation regions spaced a first distance from each other. In addition, the trench isolation regions may include a third trench isolation region spaced a second distance from one of the two trench isolation regions. In such an embodiment, the second distance may be greater than the first distance. In addition, such an arrangement of isolation regions may not, in some embodiments, include any trench isolation regions interposed between the third trench isolation region and the one of the two trench isolation regions. In such an embodiment, the upper surfaces of the third trench isolation region may be farther above the plurality of layers than upper surfaces of the two trench isolation regions.

There may be several advantages to forming structures or layers with reduced and more uniform step heights. For example, a substantially planar upper surface of a semiconductor topography may be formed. In this manner, additional structures and layers may be formed within design specifications of the device. Furthermore, step coverage problems and lithography problems may be minimized. As such, patterning distorted structures and layers may be avoided. The method as described herein may also minimize pattern density constraints since the "dishing effect" of the polishing process may be reduced. In this manner, shallow trench isolation regions having reduced and more uniform step heights may be formed. Such a formation may be particularly advantageous in patterns of varied densities.

BRIEF DESCRIPTION OF THE DRAWINGS

Other objects and advantages of the invention will become apparent upon reading the following detailed description and upon reference to the accompanying drawings in which.

Figure 1:
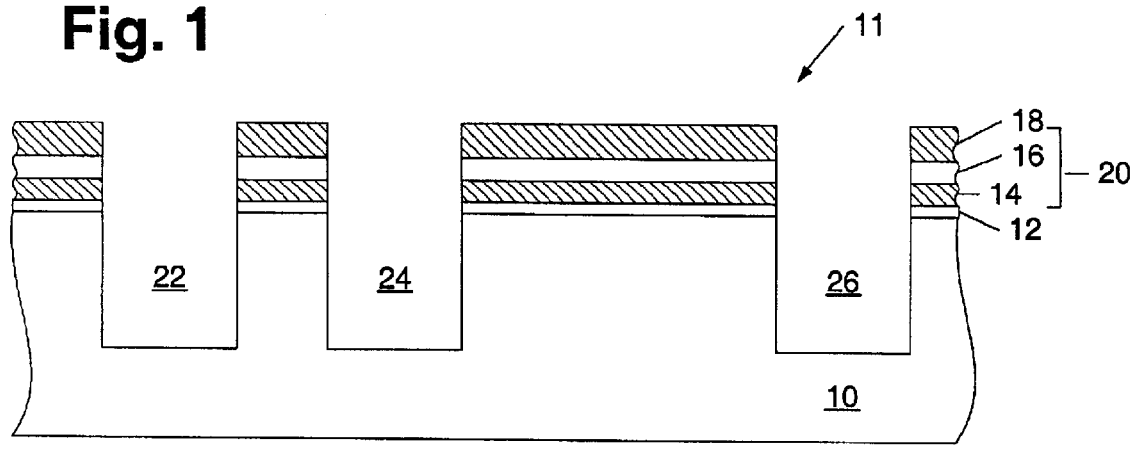
FIG. 1 depicts a partial cross-sectional view of a semiconductor topography in which a plurality of trenches are formed within a stack of layers and a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for processing a semiconductor topography is shown in FIGS. 1–6. In particular, a method is provided which includes planarizing structures and/or layers such that step heights of reduced and more uniform height may be formed. FIG. 1 depicts semiconductor topography 11 in which trenches 22, 24, and 26 may be formed within semiconductor layer 10 and stack of layers 20 arranged above semiconductor layer 10. In addition, oxide 12 may be interposed between semiconductor layer 10 and stack of layers 20. In some cases, oxide 12 may be regarded as part of stack of layers 20. Alternatively, oxide 12 may be considered separate from stack of layers 20. In another embodiment, oxide 12 may be omitted from semiconductor topography 11.

Semiconductor layer 10 may be a semiconductor substrate such as a silicon substrate, and may be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, semiconductor layer 10 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 10 may be substantially planar or may have substantial elevational differences due to the formation of such structures and layers. Doped regions (not shown) may also be formed in semiconductor layer 10. For example, doped regions may be lightly doped drain regions and heavily doped source/drain regions formed in a semiconductor layer adjacent to gate structures.

Oxide 12 may serve as a "pad oxide" to reduce inherent stresses between an overlying layer and semiconductor layer 10. For example, oxide layer 12 may serve to reduce the stresses between semiconductor layer 10 and lower layer 14 of stack of layers 20, when lower layer 14 includes silicon nitride. In some embodiments, oxide 12 may also promote adhesion of an overlying layer upon semiconductor layer 10. Oxide 12 may include a dielectric material, such as silicon dioxide ($SiO_2$), silicon oxynitride ($SiO_xN_y(H_z)$) or silicon dioxide/silicon nitride/silicon dioxide (ONO). Oxide 12 may be grown upon semiconductor layer 10 using wet or dry thermal oxidation of a silicon substrate. Alternatively, oxide 12 may be deposited on semiconductor layer 10 using chemical-vapor deposition ("CVD") from, for example, a gas that may include $SiH_4$ and $O_2$. Typically, thermally grown oxides etch at a slower rate than deposited oxides. Therefore, the selection of the oxide formation technique may depend on the etch characteristics needed in the subsequent etching processes. Oxide 12 may have a thickness, for example, between approximately 50 angstroms to approximately 250 angstroms. However, larger and smaller thicknesses of oxide 12 may be used depending on the specifications of the device.

Layers 14, 16, and 18 may together form stack of layers 20. More specifically, upper layer 18 may be formed above intermediate layer 16, which may be formed above lower layer 14. In some embodiments, upper layer 18 may be formed upon and in contact with intermediate layer 16. In addition or alternatively, intermediate layer 16 may be formed upon and in contact with lower layer 14. In an alternative embodiment (not shown), stack of layers 20 may include additional layers such as oxide 12 as discussed above or layers interposed between layers 14, 16, and/or 18. In such an embodiment, the lower layer 14 may be formed above oxide 12. In particular, lower layer 14 may be formed upon and in contact with oxide 12. Moreover, lower layer 14 may be formed upon and in contact with semiconductor layer 10 if oxide 12 is omitted. Furthermore, layers 14, 16, and/or 18 may be formed in a single process chamber. Alternatively, layers 14, 16, and 18 may each be formed within different process chambers. In some embodiments, the thickness of upper layer 18 may be between approximately 500 angstroms and approximately 1000 angstroms. The thickness of intermediate layer 16, for example, may be between approximately 300 angstroms and approximately 700 angstroms and the thickness of lower layer 14 may be between approximately 300 angstroms and approximately 500 angstroms. Smaller and/or larger thicknesses for layers 14, 16, and 18 may be appropriate, however, depending on the design specifications of the device.

Stack of layers 20 may serve to protect portions of underlying layers and structures within semiconductor layer 10. For example, stack of layers 20 may protect portions of oxide 12 and semiconductor layer 10 from an etch process which may be used to form trenches 22, 24, and 26 within semiconductor layer 10. In a preferred embodiment, stack of layers 20 may include intervening layers of different etching characteristics. As such, intermediate layer 16, as shown in FIG. 1, may include different etch characteristics than upper layer 18 and lower layer 14. In some embodiments, upper layer 18 and lower layer 14 may include similar etch characteristics. For example, upper layer 18 and lower layer 14 may include silicon nitride, while intermediate layer 16 may include silicon dioxide. In alternative embodiments, upper layer 18 and lower layer 14 may include different etch characteristics, and thus different materials. In addition or alternatively, stack of layers 20 may include intervening layers of different polishing characteristics. For example, upper layer 18 may include a polish stop material, such as silicon nitride. As such, lower layer 14 may include a material with similar polish stop characteristics. Intermediate layer 16, in such an embodiment, may include a material that polishes at a different rate than upper layer 18 and lower layer 14.

Trenches 22, 24, and 26 may be patterned using a lithography technique known to those familiar with semiconductor fabrication processes. In some embodiments, trenches 22, 24, and 26 may be used to subsequently form shallow trench isolation regions within semiconductor layer 10. Such isolation regions may be field oxide regions, which may serve to isolate separate active regions on semiconductor layer 10 from one another. In another embodiment, trenches 22, 24, and 26 may be used for the formation of, for example, contact structures using a dual-Damascene process. In such an embodiment, trenches 22, 24, and 26 may be configured to extend to a conductive region within semiconductor layer 10. The conductive region may be, for example, an underlying interconnect line or a conductive region of a device, such as source/drain regions of a transistor. Although FIG. 1 illustrates the formation of three trenches across the illustrated portion of semiconductor layer 10, any number of trenches may be formed across the substrate in accordance with design specifications of the integrated circuit. In addition, various widths and depths of the trenches may be formed in accordance with the design specifications of the integrated circuit. For example, the depth of the trenches below the upper surface of semiconductor layer 10 may be between approximately 3000 angstroms and approximately 4000 angstroms. Larger and smaller depths may be appropriate, however, depending on the design specifications of the device.

Moreover, the pattern density of the trenches 22, 24, and 26 may vary (i.e., the spacings between the trenches may not be equal) as shown in FIG. 1. For example, the region of semiconductor layer 10 between trenches 24 and 26 may be wider than the region of semiconductor layer 10 interposed between trenches 22 and 24. Numerous other spacing configurations of trenches 22, 24, and 26, however, may be used depending on the design specifications of the integrated circuit. For example, trenches 22, 24, and 26 may be uniformly spaced across semiconductor layer 10. In another embodiment, the width of the spacing between trenches 24 and 26 may continue to the right for other trench spacings of similar widths. Likewise, the width of the spacing between trenches 22 and 24 may continue to the left for other trench spacings of similar widths. For example, an array of memory transistors may be fabricated within a region including a plurality of adjacent trench spacings similar to the spacing between trenches 22 and 24 or trenches 24 and 26. In an alternative embodiment, trench spacings of different widths may continue to the right or left of the illustrated portion of semiconductor layer 10.

Figure 2:
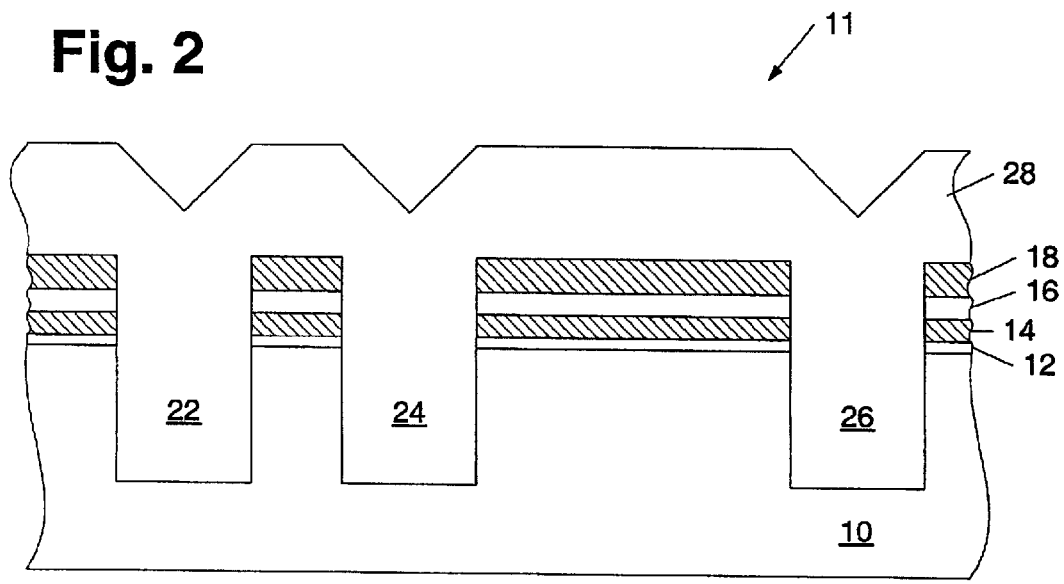
FIG. 2 depicts a partial cross-sectional view of the semiconductor topography in which a fill layer is formed within the trenches and above the stack of layers subsequent to the trench formation of FIG. 1.

Turning to FIG. 2, trenches 22, 24, and 26 may be filled with fill layer 28. In addition, fill layer 28 may be formed upon upper layer 18 adjacent to the trenches. In a preferred embodiment, fill layer 28 may include a material with different polishing characteristics than that of upper layer 18. For example, fill layer 28 may include a dielectric material such as, silicon dioxide ($SiO_2$), silicon oxynitride ($SiO_xN_y$ ($H_z$)), silicon carbide, or carbonated polymers when upper layer 18 includes silicon nitride. Alternatively, fill layer 28 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. Fill layer 28 may also be undoped or may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight. In other embodiments, fill layer 28 may include conductive material such as doped polysilicon, titanium, tungsten, aluminum, or metal alloy thereof.

Furthermore, fill layer 28 may be deposited conformally and thus, may have a non-planar upper surface as shown in FIG. 2. Alternatively, fill layer 28 maybe relatively planar if the underlying structures and layers are substantially planar before the deposition of fill layer 28. Preferably, fill layer 28 may be formed upon semiconductor topography 11 of FIG. 1 such that the entirety of the upper surface of fill layer 28 is spaced above semiconductor layer 10. Forming fill layer 28 to such a thickness allows semiconductor topography 11 to be subsequently polished to a substantially planar surface spaced above semiconductor layer 10. In some cases, fill layer 28 may be formed to a thickness such that the entirety of the upper surface of fill layer 28 may be spaced above trenches 22, 24, and 26 and thus above upper layer 18 as shown in FIG. 2. In this manner, the height of the trenches may depend upon the layers present in stack of layers 20 and the depth of the trenches in semiconductor layer 10. In an alternative embodiment, fill layer 28 may be deposited in a manner such that the entirety of its upper surface may be above the upper surface of semiconductor layer 10, but below the upper surface of upper layer 18.

Figure 3:
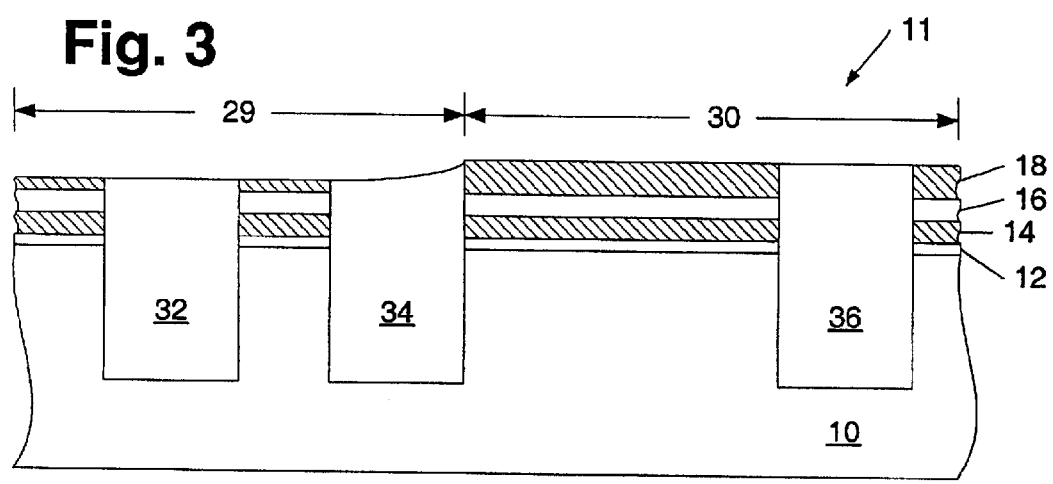
FIG. 3 depicts a partial cross-sectional view of the semiconductor topography in which the fill layer is polished to expose an upper layer of the stack of layers subsequent to the fill layer formation of FIG. 2.

Subsequent to deposition of fill layer 28, semiconductor topography 11 may be polished to expose upper layer 18 as illustrated in FIG. 3. In a preferred embodiment, such a polishing process may include removing portions of fill layer 28 arranged upon the upper surface of upper layer 18. In this manner, the polishing fill layer 28 may include polishing the upper portion of semiconductor topography 11 such that remaining portions 32, 34, and 36 of fill layer 28 are laterally confined by sidewalls of the trenches. In some cases, polishing fill layer 28 may include polishing a portion of upper layer 18. However, the polishing of fill layer 28, in such an embodiment, preferably does not polish through upper layer 18. As such, in an embodiment in which portions of fill layer 28 arranged upon the upper surface of upper layer 18 are removed, the thickness of upper layer 18 is preferably sufficient to prevent polishing through upper layer 18.

In some cases, such a polishing process may polish portions of semiconductor topography 11 at different rates. As a result, semiconductor topography 11 may include, for example, region 29 at a lower height than region 30 as illustrated in FIG. 3. Such a variation in polishing rates may be due to the pattern density of the trenches formed in FIG. 1. In particular, the spacings between trenches 22, 24, and 26 may contribute to the variation in polishing rates during the polishing of upper layer 18. For example, since the spacing between trenches 22 and 24 is less than the spacing between trenches 24 and 26, a smaller lateral portion of upper layer 18 may be present in the spacing between trenches 22 and 24. Since upper layer 18 preferably includes a polish stop material and fill layer 28 preferably includes a material with different polishing characteristics than upper layer 18, a variation of polishing rates may result upon exposure of upper layer 18 during the polishing process. More specifically, region 29 of semiconductor topography 11, which includes a relatively small portion of upper layer 18, may polish at a faster rate than region 30 of semiconductor topography, which includes a larger lateral portion of upper layer 18.

Furthermore, in an embodiment in which fill layer 28 is deposited upon a substantially non-planar surface, the upper surface of fill layer 28 may be substantially non-planar. As such, recessed regions within fill layer 28 may exist above trenches 22, 24, and 26 as shown in FIG. 2. As previously discussed, such recesses may trap slurry used within the polishing process and/or cause the polishing pad to deform to the contour of the topography. As such, the polishing process may polish at a faster rate in regions of the topography that include more recesses than other regions of the topography. In this manner, region 29 may be polished at a faster rate than region 30 as illustrated by the elevational differences of the two regions in FIG. 3.

Figure 4:
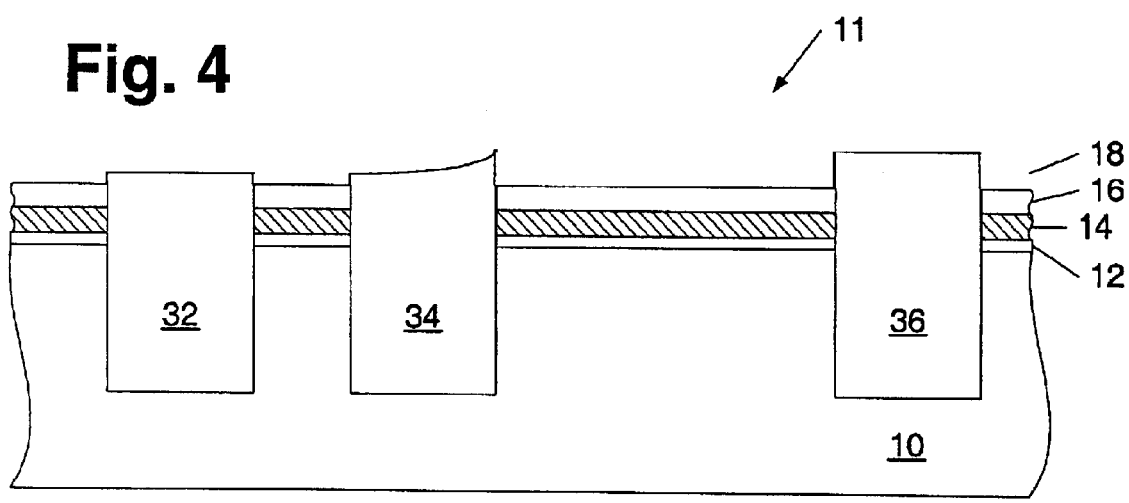
FIG. 4 depicts a partial cross-sectional view of the semiconductor topography in which the upper layer is etched to expose an intermediate layer subsequent to the fill layer polishing of FIG. 3.

FIG. 4 illustrates the removal of the remaining portions of upper layer 18 to expose intermediate layer 16. Such a removal of upper layer 18 may be conducted by wet or dry etch techniques. Preferably, the removal of the remaining portions of upper layer 18 is selective to upper layer 18 over fill layer 28 and intermediate layer 16. In this manner, the removal of upper layer 18 may not remove intermediate layer 16 to expose lower layer 14. In addition, the selectivity of the removal of upper layer 18 may allow remaining portions 32, 34, and 36 of fill layer 28 to remain above the adjacent portions of intermediate layer 16. In particular, the thickness of the sections of remaining portions 32, 34, and 36 extending above adjacent portions of intermediate layer 16 may vary between approximately 0 angstroms and approximately 1000 angstroms, depending on the amount of upper layer 18 removed during the polishing process.

Figure 5A:
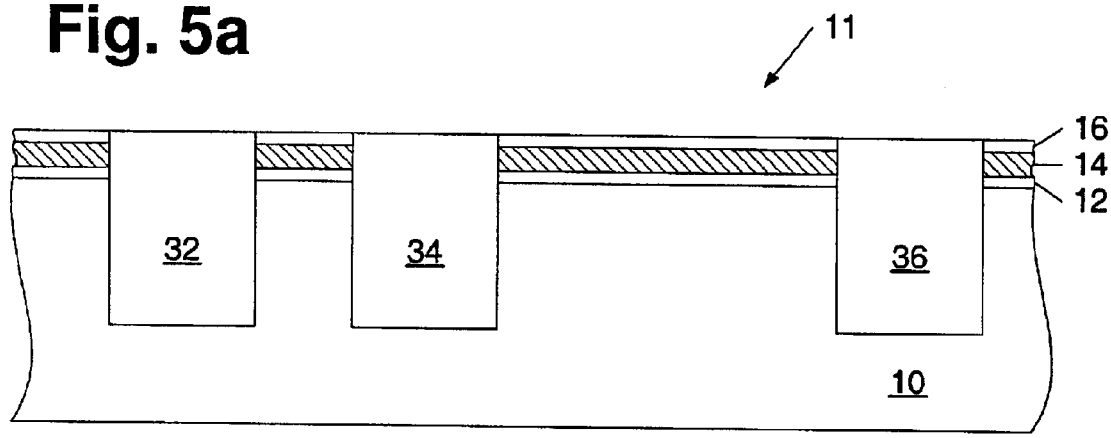
FIG. 5a depicts a partial cross-sectional view of the semiconductor topography in which the topography of FIG. 4 is polished to an elevation above a lower layer of the stack subsequent to the upper layer etching of FIG. 4.
Figure 5B:
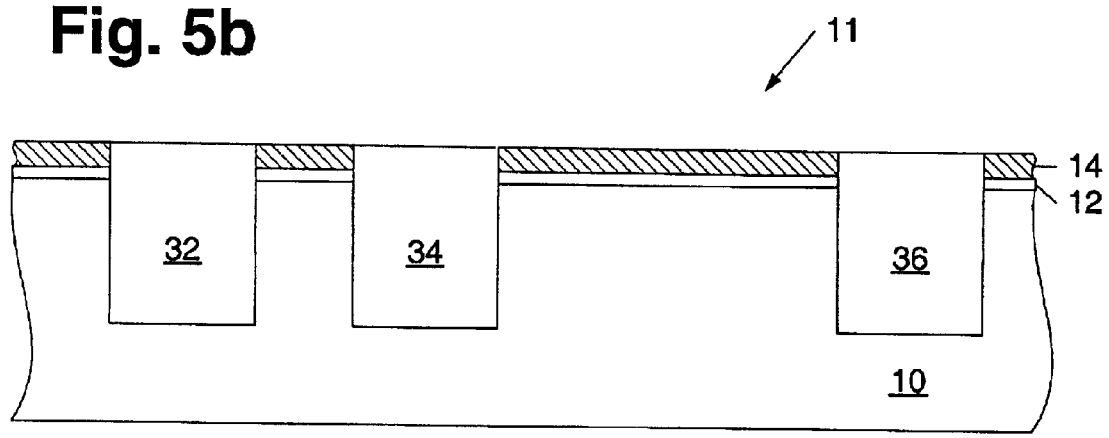
FIG. 5b depicts a partial cross-sectional view of the semiconductor topography in which the topography of FIG. 4 is polished to expose a lower layer of the stack subsequent to the upper layer etching of FIG. 4.

Semiconductor topography 11 may then be planarized. The planarization process may include polishing the topography using polishing processes, such as CMP or fixed abrasive polishing. In some embodiments, the topography may be planarized to an elevation above lower layer 14 as shown in FIG. 5a. In an alternative embodiment, the topography may be planarized to expose lower layer 14 as shown in FIG. 5b. In some cases, the planarizing process may include polishing a portion of lower layer 14. In either embodiment, the planarization process is preferably terminated upon forming a substantially planar surface. In addition, intermediate layer 16 preferably includes similar polishing characteristics to that of fill layer 28. In this manner, the planarization process may not be affected by the same undesirable consequences as described with the polishing process used to polish the topography of FIG. 2. More specifically, a substantially planar surface may be obtained since there is no variation in polishing characteristics across the semiconductor topography. In addition, the process of polishing the topography of FIG. 4 may be shorter than the process polishing the topography of FIG. 2. As such, the polishing process may be short enough such that portions of semiconductor topography 11 adjacent to remaining portions 32, 34, and 36 may not experience "dishing".

Figure 6:
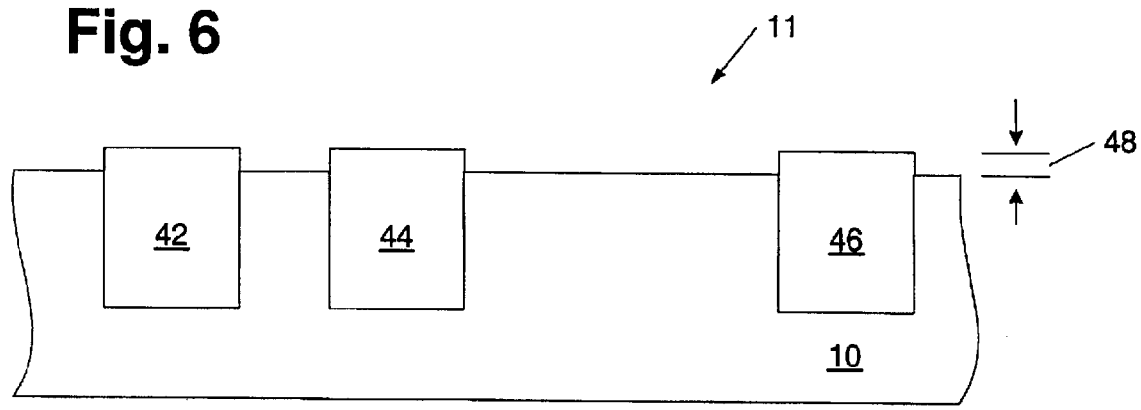
FIG. 6 depicts a partial cross-sectional view of the semiconductor topography in which topographies of FIGS. 5a or 5b are etched to form isolation regions subsequent to the topography etching of FIGS. 5a and 5b.

The planarized portions of semiconductor topography 11 adjacent to remaining portions 32, 34, and 36 may then be removed to expose portions of semiconductor layer 10 as shown in FIG. 6. Such a removal process may include etching the topography in a series of etching steps. In this manner, the etch process allows semiconductor layer 10 to be exposed, but does not produce dishing of isolation regions. In some embodiments, the removal process may include etching remaining portions of intermediate layer 16 to expose lower layer 14. In such an embodiment, portions of remaining portions 32, 34, and 36 are preferably etched along with remaining portions of intermediate layer 16, since fill layer 28 and intermediate layer 16 may include similar etch characteristics.

In addition or alternatively, the removal process may include etching remaining portions of lower layer 14 to expose oxide 12. In such an etch process, lower layer 14 may be etched at a substantially faster rate than laterally adjacent portions of fill layer 28. In this manner, lower layer 14 may include a material of different etch characteristics than fill layer 28. In addition, an etch chemistry that is selective to the material of lower layer 14 over fill layer 28 is preferably used. As such, the upper surface of remaining portions 32, 34, and 36 may be above the upper surface of oxide 12. In particular, the thickness of the sections of remaining portions 32, 34, and 36 extending above adjacent portions of oxide 12 may vary between approximately 150 angstroms and approximately 700 angstroms, depending on the amount of lower layer 14 removed during the polishing process. In some embodiments, the thickness of the sections of remaining portions 32, 34, and 36 extending above adjacent portions of oxide 12 may vary between approximately 150 angstroms and approximately 250 angstroms. Moreover, the removal process may include etching portions of remaining portions 32, 34, and 36 along with remaining portions of oxide 12 after lower layer 14 has been removed. In this manner, fill layer 28 and oxide 12 may include similar etch characteristics.

Consequently, structures 42, 44, and 46 may be formed within semiconductor topography 11. For example, in some embodiments, structures 42, 44, and 46 may include shallow trench isolation regions. Such structures may include step heights 48, which are the portion of structures 42, 44, and 48 residing above the upper surface of semiconductor layer 10. In some embodiments, step height 48 may be less than approximately 500 angstroms. More specifically, step height 48 may be between approximately 300 angstroms and 500 angstroms and in preferred embodiments approximately 400 angstroms. In an embodiment in which structures 42, 44, and 46 are isolation regions, such step heights of minimal thickness formed above semiconductor layer 10 may offer the additional benefit of preventing poly stringers from forming during subsequent processing, while insuring that the active regions of the semiconductor topography are sufficiently isolated. In a preferred embodiment, the average thicknesses of the each of step heights 48 corresponding to structures 42, 44, and 46 may differ by less than approximately 10%, or more preferably by less than approximately 5%. Since trenches 22, 24, and 26 are preferably formed with substantially level bases, the thickness variation between structures 42, 44, and 46 may differ by less than approximately 10% and in some embodiments, by less than approximately 5%. In some embodiments, the thickness variation between structures 42, 44, and 46 differ by less than approximately 250 angstroms, and more preferably by less than approximately 200 angstroms.

In some embodiments, lower layer 14 may serve as a step-definition layer. In this manner, lower layer 14 may be used to subsequently form structures including step heights. More specifically, the thickness of step height 48 may depend on the thickness of lower layer 14. As such, lower layer 14 may have, for example, a starting thickness between approximately 300 angstroms and approximately 500 angstroms. In an embodiment in which a portion of layer 14 is removed during the polishing process described in FIG. 5b, the thickness of the remaining portion of layer 14 may be between approximately 75 angstroms and 125 angstroms.

Although discussed above with reference to shallow trench isolation regions, the method described herein may be useful in other applications involving polishing of dielectrics. In particular, the method described herein is believed to be useful for cases in which a topography is to be planarized. More specifically, the method may be advantageous for planarizing a dielectric that is arranged above a stack of layers having intervening layers of polishing characteristics. Incorporating a sequence of polishing, etching, and polishing the topography again may prevent undesirable effects such as polish damage or dishing. This type of application may arise, for example, during polishing of gap-fill dielectrics used between, e.g., transistor gates or interconnect lines, or between features in micro-electromechanical system (MEMS) structures. The method described herein may therefore reduce the thickness of polish stop layers for applications other than the shallow trench isolation embodiments described above.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, the method described herein could be applied not just to polishing a layer formed above a semiconductor layer, but to polishing various features or layers within a semiconductor topography. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:

polishing an upper layer of the semiconductor topography to expose a first underlying layer;

etching away remaining portions of said first underlying layer to expose a second underlying layer, wherein the first underlying layer is formed upon and in contact with the second underlying layer;

subsequently planarizing the topography, wherein said planarizing comprises polishing the second underlying layer; and etching the planarized topography such that a third underlying layer is removed, wherein the third underlying layer is arranged beneath the second underlying layer.

2. The method of claim 1, wherein said polishing the upper layer comprises removing portions of the upper layer arranged above an upper surface of the first underlying layer.

3. The method of claim 1, wherein said polishing the upper layer comprises polishing a portion of the first underlying layer.

4. The method of claim 3, wherein a thickness of the first underlying layer is sufficient to prevent polishing through the first underlying layer during said polishing the upper layer.

5. The method of claim 1, further comprising forming the upper layer, the first underlying layer, and the second underlying layer upon a semiconductor layer and in a single process chamber.

6. The method of claim 1, further comprising depositing the upper layer within a trench of the semiconductor topography prior to said polishing.

7. The method of claim 1, wherein said polishing the upper layer comprises polishing the upper layer such that remaining portions of the upper layer are laterally confined by sidewalls of the trench.

8. The method of claim 1, wherein said etching the planarized topography comprises removing a portion of the second underlying layer.

9. A method for fabricating shallow trench isolation regions, comprising:

forming one or more trenches extending through a stack of at least three layers arranged over a semiconductor substrate, wherein the stack comprises intervening layers of different etching characteristics;

blanket depositing a dielectric over the one or more trenches and the stack such that the one or more trenches are filled by the dielectric; and planarizing the dielectric such that upper surfaces of the dielectric remaining within the one or more trenches are coplanar with an upper surface of an adjacent layer or the stack, wherein said planarizing comprises removing one or more of the at least three layers of the stack, and wherein said planarizing further comprises:
polishing the dielectric to expose an upper layer of the stack;
etching the upper layer to expose an intermediate layer of the stack, wherein the upper layer is formed upon and in contact with the intermediate layer; and
subsequently polishing the dielectric and the intermediate layer to expose the upper surface of the adjacent layer of the stack.

10. The method of claim 9, wherein said subsequently polishing is sufficient to produce a substantially planar surface without dishing portions of the adjacent layer.

11. The method of claim 9, wherein a thickness of said upper layer is between approximately 500 angstroms and approximately 1000 angstroms prior to said planarizing.

12. The method of claim 9, wherein said upper layer comprises silicon nitride.

13. The method of claim wherein a thickness of said intermediate layer is between approximately 300 angstroms and approximately 700 angstroms prior to said planarizing.

14. The method of claim 9, wherein said intermediate layer comprises silicon dioxide.

15. The method of claim 9, wherein said intermediate layer and said dielectric comprise similar etch characteristics.

16. The method of claim 9, wherein said adjacent layer comprises the intermediate layer.

17. The method of claim 9, wherein said adjacent layer comprises a lower layer of the slack.

18. The method of claim 17, wherein a thickness of said lower layer is between approximately 300 angstroms and approximately 500 angstroms prior to said planarizing.

19. The method of claim 9, wherein said lower layer comprises silicon nitride.

20. The method of claim 9, further comprising etching the upper surface of the adjacent layer to expose the semiconductor substrate.

21. The method of claim 20, wherein upper portions of the dielectric extend less than approximately 500 angstroms above an upper surface of the semiconductor substrate subsequent to said etching the upper surface.

22. The method of claim 21, wherein the upper portions of the dielectric extend between approximately 300 angstroms and approximately 500 angstroms above the upper surface of the semiconductor substrate subsequent to said etching the upper surface.

23. The method of claim 20, wherein average thicknesses of upper portions of the dielectric extending above the semiconductor substrate and corresponding to each of the one or more trenches differ by less than approximately 10%.

24. The method of claim 1, further comprising etching a fourth layer arranged beneath the third layer subsequent to removing the third layer.

* * * * *

UNITED STATES PATENT AND TRADEMARK OFFICE
CERTIFICATE OF CORRECTION

PATENT NO. : 6,777,307 B1
DATED : August 17, 2004
INVENTOR(S) : Ramkumar et al.

It is certified that error appears in the above-identified patent and that said Letters Patent is hereby corrected as shown below:

Column 13,
Line 24, please delete "claim 1" and substitute therefor -- claim 6 --.
Lines 43-44, please delete "layer or the stack" and substitute therefor -- layer of the stack --.

Column 14,
Line 13, please delete "claim wherein" and substitute therefor -- claim 9, wherein --.
Line 24, please delete "slack" and substitute therefor -- stack --.
Line 28, please delete "claim 9" and substitute therefor -- claim 17 --.

Signed and Sealed this

Seventh Day of December, 2004

JON W. DUDAS
*Director of the United States Patent and Trademark Office*